(12) United States Patent
Endo

(10) Patent No.: US 9,922,807 B2
(45) Date of Patent: Mar. 20, 2018

(54) SPUTTERING TARGET AND METHOD FOR PRODUCTION THEREOF

(71) Applicant: JX Nippon Mining & Metals Corporation, Tokyo (JP)

(72) Inventor: Yousuke Endo, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/896,522

(22) PCT Filed: Mar. 27, 2014

(86) PCT No.: PCT/JP2014/058987
§ 371 (c)(1),
(2) Date: Dec. 7, 2015

(87) PCT Pub. No.: WO2015/004958
PCT Pub. Date: Jan. 15, 2015

(65) Prior Publication Data
US 2016/0126072 A1    May 5, 2016

(30) Foreign Application Priority Data
Jul. 8, 2013  (JP) .................................. 2013-143068

(51) Int. Cl.
*H01J 37/34*     (2006.01)
*B22D 21/00*    (2006.01)
(Continued)

(52) U.S. Cl.
CPC .......... *H01J 37/3426* (2013.01); *B22D 21/00* (2013.01); *B22D 21/007* (2013.01);
(Continued)

(58) Field of Classification Search
CPC .... B22D 21/00; B22D 21/007; B22D 21/027; B22D 27/08; C22C 28/00; C22F 1/16;
(Continued)

(56) References Cited

U.S. PATENT DOCUMENTS 3,046,651 A   7/1962  Olmon et al.
4,124,474 A   11/1978 Bomchil et al.
(Continued)

FOREIGN PATENT DOCUMENTS

CN   1351961 A    6/2002
CN   101801565 A  8/2010
(Continued)

OTHER PUBLICATIONS

Alloy Digest, Indium Semi-Conductor Grade (data sheet), ASM International, Mar. 1998, 2 pages.
(Continued)

*Primary Examiner* — Rodney G McDonald
(74) *Attorney, Agent, or Firm* — Nields, Lemack & Frame, LLC

(57) ABSTRACT

A sputtering target according to the disclosure includes 5 wtppm to 10,000 wtppm of Cu and the balance of In and has a relative density of 99% or more and an average grain size of 3,000 μm or less.

12 Claims, 1 Drawing Sheet

(51) Int. Cl.
*C22C 28/00* (2006.01)
*C22F 1/16* (2006.01)
*C23C 14/14* (2006.01)
*C23C 14/34* (2006.01)
*B22D 21/02* (2006.01)
*B22D 27/08* (2006.01)

(52) U.S. Cl.
CPC ........... *B22D 21/027* (2013.01); *B22D 27/08* (2013.01); *C22C 28/00* (2013.01); *C22F 1/16* (2013.01); *C23C 14/14* (2013.01); *C23C 14/3414* (2013.01); *H01J 37/3423* (2013.01)

(58) Field of Classification Search
CPC .. C23C 14/14; C23C 14/3414; H01J 37/3423; H01J 37/3426
USPC ......................................... 204/298.12, 298.13
See application file for complete search history.

(56) References Cited

U.S. PATENT DOCUMENTS

| | | | |
|---|---|---|---|
| 5,054,195 | A | 10/1991 | Keck et al. |
| 5,269,453 | A | 12/1993 | Melton et al. |
| 5,630,918 | A | 5/1997 | Takahara et al. |
| 6,030,514 | A | 2/2000 | Dunlop et al. |
| 6,309,556 | B1 | 10/2001 | Joyce et al. |
| 6,719,034 | B2 | 4/2004 | Heck et al. |
| 9,023,487 | B2 | 5/2015 | Endo et al. |
| 9,139,900 | B2 | 9/2015 | Endo et al. |
| 9,490,108 | B2 | 11/2016 | Endo et al. |
| 2003/0089482 | A1 | 5/2003 | Heck et al. |
| 2004/0022664 | A1* | 2/2004 | Kubota ................... C23C 14/14 420/550 |
| 2005/0029675 | A1 | 2/2005 | Hua |
| 2005/0269385 | A1 | 12/2005 | Chen et al. |
| 2005/0279630 | A1 | 12/2005 | Fonte |
| 2008/0271779 | A1 | 11/2008 | Miller et al. |
| 2008/0289958 | A1 | 11/2008 | Kardokus et al. |
| 2009/0057141 | A1 | 3/2009 | Tauchi et al. |
| 2009/0065354 | A1 | 3/2009 | Kardokus et al. |
| 2009/0250337 | A1 | 10/2009 | Simons et al. |
| 2009/0277777 | A1 | 11/2009 | Schultheis et al. |
| 2010/0099214 | A1 | 4/2010 | Buquing |
| 2010/0165585 | A1 | 7/2010 | Lin et al. |
| 2011/0067997 | A1 | 3/2011 | Nguyen et al. |
| 2011/0089030 | A1 | 4/2011 | Juliano et al. |
| 2011/0155560 | A1 | 6/2011 | Kuramochi et al. |
| 2011/0163447 | A1 | 7/2011 | Fukushima et al. |
| 2012/0205242 | A1 | 8/2012 | Tamura et al. |
| 2012/0213917 | A1* | 8/2012 | Simons ............... C23C 14/3414 427/74 |
| 2012/0273348 | A1 | 11/2012 | Endo et al. |
| 2013/0037408 | A1 | 2/2013 | Endo et al. |
| 2013/0105311 | A1 | 5/2013 | Maekawa et al. |
| 2013/0143069 | A1 | 6/2013 | Endo et al. |
| 2013/0153414 | A1 | 6/2013 | Endo et al. |
| 2013/0264200 | A1* | 10/2013 | Schlott ................ C23C 14/3414 204/298.13 |
| 2013/0270108 | A1* | 10/2013 | Endo ................... C23C 14/3414 204/298.13 |
| 2014/0042018 | A1 | 2/2014 | Yamazaki |
| 2015/0303039 | A1 | 10/2015 | Endo et al. |

FOREIGN PATENT DOCUMENTS

| | | | |
|---|---|---|---|
| CN | 102165093 | A | 8/2011 |
| CN | 102644053 | A | 8/2012 |
| CN | 102741450 | A | 10/2012 |
| CN | 102782180 | A | 11/2012 |
| DE | 10063383 | C1 | 3/2002 |
| EP | 0500031 | A1 | 8/1992 |
| EP | 2287356 | A1 | 2/2011 |
| EP | 2612953 | A1 | 7/2013 |
| JP | 57-185973 | A | 11/1982 |
| JP | 58-145310 | A | 8/1983 |
| JP | 63-44820 | A | 2/1988 |
| JP | 63-111172 | A | 5/1988 |
| JP | 3-99741 | A | 4/1991 |
| JP | 4-301074 | A | 10/1992 |
| JP | 5-214519 | A | 8/1993 |
| JP | 6-287661 | A | 10/1994 |
| JP | 8-60352 | A | 3/1996 |
| JP | 8-218165 | A | 8/1996 |
| JP | 8-281208 | A | 10/1996 |
| JP | 9-25564 | A | 1/1997 |
| JP | 10-280137 | A | 10/1998 |
| JP | 11-236664 | A | 8/1999 |
| JP | 2003-89869 | A | 3/2003 |
| JP | 2003-136190 | A | 5/2003 |
| JP | 2003-183820 | A | 7/2003 |
| JP | 2003-533589 | A | 11/2003 |
| JP | 2004-131747 | A | 4/2004 |
| JP | 2005-2364 | A | 1/2005 |
| JP | 2006-102807 | A | 4/2006 |
| JP | 2006-322039 | A | 11/2006 |
| JP | 2008-523251 | A | 7/2008 |
| JP | 2009-242882 | A | 10/2009 |
| JP | 2010-24474 | A | 2/2010 |
| JP | 2011-236445 | A | 11/2011 |
| JP | 4837785 | B1 | 12/2011 |
| JP | 2012-052190 | A | 3/2012 |
| JP | 2012-172265 | A | 9/2012 |
| JP | 2012-251174 | A | 12/2012 |
| TW | I310409 | B | 6/2009 |
| WO | 01/73156 | A2 | 10/2001 |
| WO | 2012/029363 | A1 | 3/2012 |
| WO | 2012/029364 | A1 | 3/2012 |
| WO | 2012/108074 | A1 | 8/2012 |
| WO | 2012/140928 | A1 | 10/2012 |
| WO | 2014/030362 | A1 | 2/2014 |

OTHER PUBLICATIONS

Glossary of Metallurgical and Metalworking Terms, Metals Handbook, ASM Handbooks Online, ASM International, 2002, pp. 130-131, 4 pages.
A Dictionary of Chemistry, Sixth Edition, 2008, p. 283, p. 434, John Daintith, ed., 4 pages.
International Search Report dated Aug. 9, 2011 in co-pending PCT application No. PCT/JP2011/065585.
Written Opinion of the International Searching Authority dated Aug. 9, 2011 in co-pending PCT application No. PCT/JP2011/065585.
International Preliminary Report on Patentability transmitted Sep. 12, 2013 in co-pending PCT application No. PCT/JP2011/065585.
International Search Report dated Aug. 9, 2011 in co-pending PCT application No. PCT/JP2011/065587.
International Preliminary Report on Patentability dated Oct. 31, 2013 in co-pending PCT application No. PCT/JP2011/065587.
Taiwanese Communication, with English translation, dated Aug. 27, 2012 in co-pending Taiwanese patent application No. 100127178.
International Search Report dated Jun. 28, 2011 in co-pending PCT application No. PCT/JP2011/061682.
International Preliminary Report on Patentability dated Mar. 14, 2013 in co-pending PCT application No. PCT/JP2011/061682.
European communication dated Jan. 2, 2014 in co-pending European patent application No. 11821381.8.
International Search Report dated Aug. 28, 2012 in co-pending PCT application No. PCT/JP2012/068838.
International Preliminary Report on Patentability dated Mar. 25, 2014 in co-pending PCT application No. PCT/JP2012/068838.
International Search Report dated Jun. 7, 2011 in co-pending PCT application No. PCT/JP2011/060969.
International Preliminary Report on Patentability dated Feb. 28, 2013 in co-pending PCT Application No. PCT/JP2011/060969.
International Search Report dated Sep. 11, 2012 in co-pending PCT application No. PCT/JP2012/070766.
Written Opinion of the International Searching Authority transmitted Jun. 7, 2013 in co-pending PCT application No. PCT/JP2012/070766.

(56) References Cited

OTHER PUBLICATIONS

International Preliminary Report on Patentability dated Jul. 17, 2014 in co-pending PCT application No. PCT/JP2012/070766.
International Search Report dated May 7, 2013 in co-pending PCT application No. PCT/JP2013/052263.
International Preliminary Report on Patentability dated Mar. 5, 2015 in co-pending PCT application No. PCT/JP2013/052263.
European communication dated Dec. 23, 2015 in co-pending European patent application No. 13831560.1.
International Search Report dated Jun. 24, 2014 in corresponding PCT application No. PCT/JP2014/058987.
Office Action dated Sep. 27, 2013 in related U.S. Appl. No. 13/504,338.
Office Action dated Dec. 18, 2013 in related U.S. Appl. No. 13/504,338.
Final Rejection dated Jun. 16, 2014 in related U.S. Appl. No. 13/504,338.
Final Rejection dated Sep. 22, 2014 in related U.S. Appl. No. 13/504,338.
Office Action dated Dec. 31, 2014 in co-pending U.S. Appl. No. 13/704,086.
Final Rejection dated May 4, 2015 in co-pending U.S. Appl. No. 13/704,086.
Office action dated Dec. 15, 2015 in co-pending U.S. Appl. No. 13/704,086.
Office Action dated Sep. 26, 2014 in related U.S. Appl. No. 13/809,296.
Final Rejection dated Jan. 28, 2015 in related U.S. Appl. No. 13/809,296.
Final Rejection dated May 4, 2015 in related U.S. Appl. No. 13/809,296.
Office action dated Aug. 27, 2015 in related U.S. Appl. No. 13/809,296.
Office Action dated Apr. 23, 2015 in co-pending U.S. Appl. No. 13/819,499.
Office Action dated Jul. 13, 2015 in co-pending U.S. Appl. No. 13/819,499.
Office action dated Nov. 18, 2015 in co-pending U.S. Appl. No. 13/819,499.
Office action dated Aug. 24, 2016 in co-pending U.S. Appl. No. 13/819,499.
Notice of Allowance dated Aug. 12, 2006 in co-pending U.S. Appl. No. 13/704,086.
Office action dated Aug. 4, 2016 in co-pending U.S. Appl. No. 14/375,811.
Final rejection dated Jan. 4, 2017 in co-pending U.S. Appl. No. 14/375,811.
International Preliminary Report on Patentability dated Jan. 14, 2016 in corresponding PCT application No. PCT/JP2014/058987.
Final rejection dated Apr. 7, 2016 in co-pending U.S. Appl. No. 13/819,499.
Final rejection dated Jun. 1, 2016 in co-pending U.S. Appl. No. 13/704,086.
Office action dated May 3, 2016 in co-pending U.S. Appl. No. 14/375,811.
Notice of allowance dated Apr. 12, 2017 in co-pending U.S. Appl. No. 13/819,499.
Notice of allowance dated May 4, 2017 in co-pending U.S. Appl. No. 14/375,811.
Chinese communication, with English translation, dated Apr. 7, 2017 in corresponding Chinese patent application No. 201480004453.X.
Final rejection dated Feb. 13, 2017 in co-pending U.S. Appl. No. 13/819,499.

\* cited by examiner

US 9,922,807 B2

SPUTTERING TARGET AND METHOD FOR PRODUCTION THEREOF

TECHNICAL FIELD

The present invention relates to a sputtering target for use in sputtering as a technique for producing thin films on substrates, and also relates to a method for producing such a sputtering target. In particular, the present invention proposes a technique that can contribute to the carrying out of stable sputtering while effectively removing the risk of arcing during the sputtering.

BACKGROUND ART

In recent years, as the demand for photovoltaic power generation has increased, solar cells for that purpose have been developed, and various studies have been conducted to improve the light absorbing performance of light absorbing layers for solar cells, which are generally formed by sequentially disposing a back electrode layer, a light absorbing layer, a resistance buffer layer, and a transparent conductive layer on a substrate.

The light absorbing layer can be formed using a CIGS alloy, which is known to absorb wavelengths covering wide part of the spectral range of sunlight and have high ability to absorb light. Specifically, the light absorbing layer can be formed by sputtering onto a substrate such as a glass substrate using, as a sputtering target, a CIGS alloy composed of Cu, In, Ga, Se, and other elements.

Such sputtering for forming the light absorbing layer and other layers may be performed using a planar sputtering target bonded to a planar backing plate. In this case, annular part of the planar surface of the target is consumed, and the target surface region that can be used decreases, so that the surface cannot be effectively used. Therefore, in order to increase the efficiency of use of the target surface, so-called rotary sputtering technology has been put to use. In such technology, sputtering is performed using a cylindrical sputtering target, which is bonded to the outer surface of a cylindrical backing tube and rotated around its axis during the sputtering. FIG. 1 is a schematic diagram showing such a cylindrical sputtering target. FIG. 1 shows a cylindrical sputtering target 100 formed on the outer circumference of a cylindrical backing tube 101.

For example, as described in Patent Literature 1, conventional sputtering targets made of indium, including both planar and cylindrical types, are generally formed by a melt casting process that includes placing a backing plate or tube or other supporting substrate in a mold, pouring molten indium into the casting space of the mold in that state, in which the surface of the supporting substrate is exposed, and cooling and solidifying the molten indium.

In this melt casting process, the indium solidification rate during the cooling is difficult to keep constant over the whole of the casting space for forming the sputtering target. Particularly when a sputtering target with a length of more than 1 m is produced, the resulting sputtering target can have a non-uniform structure and coarse crystal grains. If sputtering is performed using such a target, it will be difficult to deposit a film with a sufficiently uniform thickness distribution on a substrate.

On the other hand, Patent Literature 2 shows that a tube-shaped sputtering target is deposited on a carrier tube by spraying molten indium onto the carrier tube being rotated. Concerning the use of such thermal spraying, Patent Literature 2 states that "The tubes thus produced had a fine-grained microstructure having a mean grain size of 50 to 500 μm depending on the process parameters. In most cases, the resulting mean grain sizes were less than 200 μm." and that "Owing to the production of the sputtering target according to the invention in the form of layers, the microstructure is homogeneous across the thickness and jacket surface of the sputtering target."

CITATION LIST

Patent Literatures

Patent Literature 1: JP 63-44820 B
Patent Literature 2: JP 2012-172265 A

SUMMARY OF INVENTION

Technical Problem

However, sputtering targets formed by a thermal spraying method such as that described in Patent Literature 2 have the disadvantage that they have a relatively low density, although the method can form fine crystal grains. In addition, also shown in Patent Literature 2, sputtering targets formed by a thermal spraying method can have a high oxygen content. In particular, the reduction in sputtering target density may be a cause of arcing during sputtering and therefore raises a problem in that films cannot be stably deposited on a substrate.

The present invention aims to solve these problems with conventional techniques. It is therefore an object of the present invention to provide a sputtering target that has a density high enough to make it possible to effectively eliminate a cause of arcing during sputtering so that stable sputtering can be performed and that makes it possible to form films with a uniform thickness on a substrate by sputtering, and to provide a method for producing such a sputtering target.

Solution to Problem

The inventor has found that a sputtering target can have not only a density as high as that obtained by conventional melt casting methods but also crystal grains made effectively fine when the sputtering target is produced by a process that includes adding a small amount of copper to indium, then casting the mixture into a sputtering target raw material, for example, by a melt casting method, and subjecting the sputtering target raw material to a given plastic working process.

Based on the finding, the present invention provides a sputtering target including 5 wtppm to 10,000 wtppm of Cu and the balance of In and having a relative density of 99% or more and an average grain size of 3,000 μm or less.

The sputtering target of the present invention preferably has an average grain size of 10 μm to 1,000 μm, more preferably 10 μm to 500 μm, even more preferably 10 μm to 300 μm.

The sputtering target preferably has an oxygen concentration of 20 wtppm or less.

The sputtering target of the present invention may further contain 100 wtppm or less, in total, of at least one selected from S, Cd, Zn, Se, Mg, Ca, and Sn. The sputtering target of the present invention preferably has a cylindrical shape.

The present invention also provides a method for producing a sputtering target, the method including: forming a sputtering target raw material, for example, by a melt casting method, a thermal spraying method, or the like in such a manner that the sputtering target raw material is bonded to the surface of a supporting substrate, wherein the sputtering target raw material includes 5 wtppm to 10,000 wtppm of Cu and the balance of In; and then subjecting the sputtering target raw material to plastic working in the thickness direction of the sputtering target raw material at a thickness reduction rate in the range of 10% to 80%.

In the production method, the sputtering target raw material may further contain 100 wtppm or less, in total, of at least one selected from S, Cd, Zn, Se, Mg, Ca, and Sn. In the production method, the supporting substrate is preferably a cylindrical backing tube, which is used in the production of a cylindrical sputtering target.

The sputtering target raw material is also preferably formed by casting a molten metal. In this case, the molten metal is preferably stirred or agitated during the casting, and the casting is preferably performed under a nitrogen or Ar atmosphere.

Advantageous Effects of Invention

The use of the sputtering target of the present invention, which has a relative density of 99% or more and an average grain size of 3,000 µm or less, makes it possible to perform stable sputtering while effectively eliminating the risk of arcing during sputtering and also makes it possible to form films with a sufficiently uniform thickness on a substrate.

The method of the present invention for producing a sputtering target can also produce a sputtering target with a high density and a small average grain size as stated above.

DESCRIPTION OF EMBODIMENTS

Hereinafter, embodiments of the present invention will be described in detail.

The sputtering target of the present invention has a desired shape such as a planar shape bonded to the surface of a disk-shaped backing plate or a cylindrical shape bonded to the outer surface of a cylindrical backing tube. The sputtering target of the present invention, which is to be subjected to sputtering for forming a thin film on a substrate, includes 5 wtppm to 10,000 wtppm of Cu and the balance of In and has a relative density of 99% or more and an average grain size of 3,000 µm or less.

Figure 1:
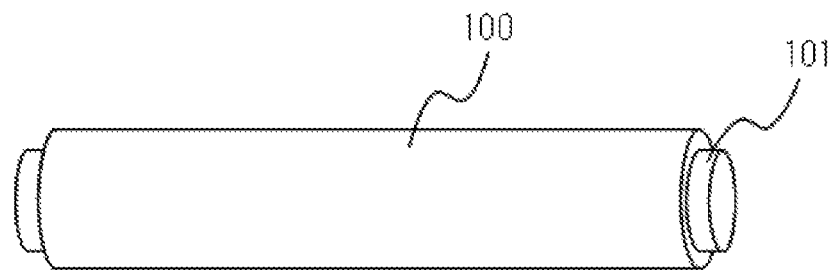
FIG. 1 is a schematic diagram showing a cylindrical sputtering target.

As illustrated in FIG. 1, the sputtering target of the present invention may be a cylindrical sputtering target 100, which is formed on the outer circumference of a cylindrical backing tube 101. In this case, the target 100 can be subjected to the rotary type sputtering mentioned above, in which the target surface can be effectively used.

In this embodiment, when 5 wtppm to 10,000 wtppm of copper is added to the sputtering target composed mainly of indium, the sputtering target can have a sufficiently small average grain size such as 3,000 µm or less after subjected to plastic working as described below.

As the copper content decreases, the copper becomes less effective in making crystal grains fine. Therefore, 5 wtppm or more of copper should be added to effectively make crystal grains fine. On the other hand, if the copper content is too high, the amount of Cu—In compounds may increase, which may cause an increase in arcing. Therefore, the upper limit of the copper content is set at 10,000 wtppm. The copper content is preferably in the range of 25 to 5,000 wtppm, more preferably in the range of 50 to 1,000 wtppm, even more preferably in the range of 100 to 500 wtppm.

Preferably, the indium should be relatively free of other impurities because if the indium contains a relatively large amount of other impurities, solar cells produced with the indium sputtering target may have lower conversion efficiency. However, the sputtering target of the present invention may contain 100 wtppm or less, in total, of at least one impurity selected from S, Cd, Zn, Se, Mg, Ca, and Sn. Such impurities at 100 wtppm or less in the sputtering target will not affect the effect of the addition of copper to make crystal grains fine. The content of such impurities is preferably 80 wtppm or less, more preferably 50 wtppm or less, most preferably 10 wtppm or less.

In the present invention, the backing tube or plate or other supporting substrates may be made of any material such as stainless steel, titanium, or copper. Preferably, the backing tube or plate or other supporting substrates are made of stainless steel or titanium, which hardly forms a solid solution with indium.

In this embodiment, the sputtering target has a relative density of 99% or more. This feature makes it possible to effectively prevent arcing during sputtering and to perform stable film formation. In other words, a sputtering target with too low a relative density can easily cause arcing, which makes it impossible to perform stable sputtering. From this point of view, the sputtering target preferably has a relative density of 99% or more, more preferably 99.2% or more, even more preferably 99.5% or more.

As used herein, the term "relative density (%)" refers to the percentage obtained by dividing the bulk density by the theoretical density. Therefore, the relative density (%) is defined by the equation: the relative density (%)={(the bulk density)/(the theoretical density)}×100. The bulk density may be calculated from the actual weight and dimensions of the sputtering target, and the value 7.31 g/cm$^3$ may be used as the theoretical density.

In this embodiment, the sputtering target has an average grain size of 3,000 µm or less. If the sputtering target has coarse crystal grains, sputtering using the target may fail to keep the formed film thickness uniform over the substrate, so that the formed film may have lower quality. In order to provide uniform film thickness on substrates, the average grain size is preferably 1,000 µm or less, more preferably 500 µm or less, even more preferably 300 µm or less. On the other hand, for example, the average grain size of the sputtering target may have a lower limit of about 10 µm.

The average grain size can be determined by the following method. Electrolytic polishing or acid etching is performed to make it easy to observe the grain boundary. Electron back scattering pattern (EBSP) is then used to produce a grain boundary map, in which the number (N) of crystal grains in a field of 1,800×3,500 µm is counted. When the orientations of adjacent crystal grains differ by at least 2°, the boundary between these grains is determined and used as the grain boundary. A crystal grain extending along the boundary between regions is counted as 0.5. The average area (s) of the crystal grains is calculated by dividing the area of the measured region (S=1,250 mm$^2$) by the number (N) of the crystal grains. Assuming that the crystal grains are spherical, the average grain size (A) is calculated from the following formula: $A=2(s/\pi)^{1/2}$.

If the sputtering target with such features has too high an oxygen concentration, arcing may occur during sputtering with the target as in the case that the density is low. Therefore, the sputtering target preferably has an oxygen concentration of 20 wtppm or less, more preferably 15 wtppm or less, even more preferably 10 wtppm or less so that the risk of arcing can be fully removed. On the other hand, the more the oxygen concentration is tried to be reduced, the higher the investment for the facility, and the lower the cost effectiveness will be. Therefore, for example, the oxygen concentration may have a lower limit of 10 wtppm.

An example of a method for producing the sputtering target will be described below. A cylindrical sputtering target can be produced, for example, as follows.

First, 5 wtppm to 10,000 wtpmm of copper is added to molten indium. The resulting molten metal is poured into the casting space of a mold. In this embodiment, before the molten metal is poured, a cylindrical backing tube is previously so placed along the inner circumference of the casting space of the mold that the outer surface of the backing tube is exposed to the casting space. It is important to stir or agitate the molten metal with a stirring rod or the like as needed so that oxide slag in the molten metal can be removed, or it is important to perform the casting in an atmosphere, such as a nitrogen or Ar atmosphere, where the oxygen content has been reduced in advance.

After the molten metal is poured into the casting space, the molten metal in the casting space is cooled and solidified, for example, using a cooling unit or the like disposed around the mold, so that a sputtering target raw material is formed so as to surround the circumference of the backing tube. In this process, the sputtering target raw material is bonded to the outer surface of the backing tube.

Figure 2:
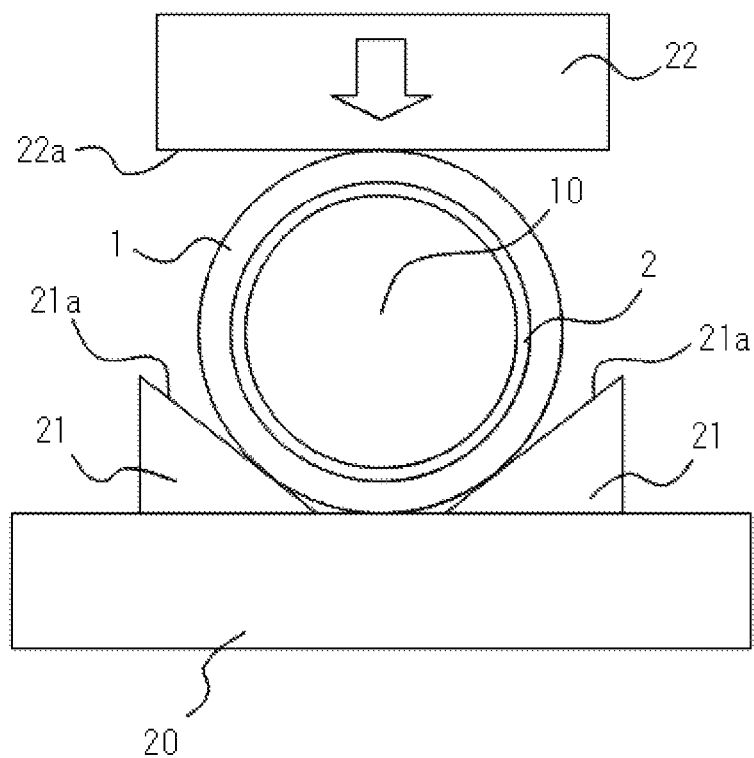
FIG. 2 is a schematic front view showing plastic working performed on a sputtering target raw material formed by casting.

Subsequently, for example, as shown in FIG. 2, the cylindrical structure in which the sputtering target raw material and the backing tube are bonded together is subjected to plastic working in such a direction as to reduce the thickness of the sputtering target raw material, specifically, the inwardly radial direction in this case. The amount of this working should be such that the thickness of the sputtering target raw material is reduced by a rate of 10% to 80%.

In general, sputtering targets obtained immediately after casting contain many coarse particles and include course crystal grains. However, when plastic working is performed as mentioned above on the sputtering target raw material, which is formed by adding Cu to indium so as to be capable of undergoing recrystallization sufficiently even at room temperature during plastic working, the recrystallization of the sputtering target raw material is facilitated to make the crystal structure fine, so that the produced sputtering target can have fine crystal grains. Thermal spraying may be used instead of the above melt casting. However, the melt casting is better than the thermal spraying because the former can forma higher-density sputtering target raw material than the latter and can also keep the cost low to achieve inexpensive production.

When produced as described above, the sputtering target can have a relative density of 99% or more and an average grain size of 3,000 μm or less and can also typically have a thickness of about 5 mm to about 20 mm, usually about 8 mm to about 15 mm as measured along the radial direction.

In this embodiment, the plastic working may be any type of working such as rolling, extruding, or press working as long as a pressure in the inwardly radial direction (or in such a direction as to reduce the thickness in the case of a planar sputtering target) is applied to the sputtering target raw material during the working, and the plastic working may be performed under any temperature conditions and may be cold or hot working.

For example, as illustrated in FIG. 2, the plastic working may be performed as follows. After the casting, a core rod 10 is inserted as needed into the backing tube 2 bonded to the inner circumference of the sputtering target raw material 1. The core rod 10 has an outer diameter slightly smaller than the inner diameter of the tube 2. The sputtering target raw material 1 is supported by being placed between the inclined surfaces 21a of two supports 21 and the flat surface 22a of pressing means 22, in which the supports 21 are disposed on a base 20, and the pressing means 22 is spaced apart from the supports 21 in the upward direction in the drawing. In this state, the sputtering target raw material 1 is pressed by moving the pressing means 22 toward the base 20 as indicated by the arrow in the drawing until a predetermined thickness reduction rate is reached, so that the thickness reduction is performed in the same amount of working over the whole circumference. Although not shown, the supports and the pressing means may each have a curved surface similar to the outer surface of the sputtering target raw material 1, instead of the flat inclined surface 21a or the flat surface 22a shown in the drawing.

During this pressing process, the core rod 10 functions to support the sputtering target material from the inner circumference side and to keep the cylindrical shape of the target material. The core rod 10 may be made of, for example, stainless steel, cast iron, or other materials that have such a degree of hardness that they are not deformed under the action of pressing forces. Preferably, the core rod 10 is made of stainless steel in order to prevent contamination with rust and the like.

Although not shown, alternatively, the plastic working may be performed by rolling in which the sputtering target raw material is pressed between a plurality of rolls with or without the sputtering target raw material being rotated around the central axis, or the plastic working may be performed by extruding in which the sputtering target raw material is inserted into the tubular space of an extruder, in which the tubular space has a predetermined shape such as a tapered shape, and allowed to pass through the tubular space at a predetermined extrusion rate, so that the sputtering target raw material is extruded to have a desired thickness.

In this embodiment, if the amount of the plastic working is too small, the crystal structure cannot be made fine enough, and if the working amount is too large, the sputtering target raw material should be relatively thick so that the desired product thickness can be obtained, and the effect of making crystal grains fine cannot be sufficiently obtained. Therefore, the working amount should be such that the thickness reduction rate is in the range shown above. The thickness reduction rate is preferably from 10 to 80%, more preferably from 15 to 70%. The thickness reduction rate r is expressed by the formula: $r=\{(h2-h1)/h2\}\times100$, wherein h2 is the radial thickness of the target before the plastic working, and h1 is the radial thickness of the target after the plastic working.

The sputtering target produced as described above is suitable for use in forming light absorbing layers for CIGS thin film solar cells.

EXAMPLES

Next, experimental production of sputtering targets according to the present invention and evaluation of their performance will be described below.

A target of Example 1 was produced by the following method. Indium with a purity of 4 N was molten, and 5 wtppm of copper was added to the molten indium. The resulting molten metal was poured into the cylindrical casting space of a mold made of SUS 304 in which a backing tube had been placed. In the mold, the molten metal was cooled and solidified to form a sputtering target raw material. In this example, a heater was placed around the mold, and the mold was heated at 180° C. with the heater when the molten metal was poured into the casting space, whereas in the process of cooling and solidifying the molten metal, the heater was turned off so that the metal was allowed to cool in the air. The casting was performed in the air. The molten metal was stirred or agitated with a stirring rod or the like in order to remove oxide slag in the molten metal. The backing tube used was made of SUS 304 and had a length of 640 mm in the axial direction, an inner diameter of 125 mm, and an outer diameter of 133 mm.

Subsequently, a SUS 304 core rod was inserted into the inside of the sputtering target raw material. In this state, the sputtering target raw material was placed as shown in FIG. 2 and cold pressed by the pressing means every time the sputtering target raw material was rotated by 5° around the axis, so that plastic working was performed under room temperature conditions in such an amount of working that a thickness reduction rate of 14.3% was achieved over the whole circumference. This working amount was the average of thickness reduction rates measured at four points 90° apart around the circumference of one end (end A) of the sputtering target raw material. A target of Example 1 was then prepared by cutting the resulting target with a lathe into a piece with a length of 600 mm in the axial direction, an inner diameter of 133 mm, and an outer diameter of 151 mm.

Examples 2 to 6 are the same as Example 1 except that the Cu content is 20, 50, 100, 1,000, and 10,000 wtppm, respectively. Example 7 is the same as Example 1 except that the Cu content is 100 wtppm and the working amount is 50%.

Examples 8 and 9 are the same as Example 1 except that 100 wtppm of Cu is added in each example and 100 wtppm of S and 100 wtppm of Zn are further added in Examples 8 and 9, respectively.

Examples 10 and 11 are the same as Examples 4 and 6, respectively, except that the target is a planar and disk-shaped sputtering target and the working amount is 80%.

Example 12 is the same as Example 1 except that the casting is performed under a nitrogen atmosphere.

Comparative Example 1 is the same as Example 1 except that Cu is not added. Comparative Example 2 is the same as Example 1 except that Cu is not added and the plastic working is not performed. Comparative Example 3 is the same as Example 1 except that Cu is not added, the sputtering target is formed using thermal spraying instead of the casting, and the plastic working is not performed.

Comparative Example 4 is the same as Example 1 except that the Cu content is 100 wtppm, the sputtering target is formed using thermal spraying instead of the casting, and the plastic working is not performed. Comparative Example 5 is the same as Example 1 except that the Cu content is 100 wtppm and the plastic working is not performed.

Each sputtering target produced as described above was measured for average grain size, relative density, and oxygen concentration, respectively. Using each sputtering target, sputtering was performed in which the thickness of the film formed on the substrate and the number of occurrences of arcing per hour were each measured.

The sputtering conditions are as follows.

Sputtering gas: Ar
Sputtering gas pressure: 0.5 Pa
Sputtering gas flow rate: 50 SCCM
Sputtering temperature: R. T. (without heating)
Input sputtering power density: 1.3 W/cm$^2$
Substrate: Eagle 2000 manufactured by Corning Incorporated, 4 inch φ×0.7 mm thick (placed opposite to the site where the film thickness is to be measured)
Deposition time: 1 minute
Pre-sputtering: 1 hour under the above conditions In this experiment, the thickness of the film formed on the substrate was measured at the following positions: a position corresponding to the longitudinally central region of the sputtering target; a position corresponding to one end (end A) of the length of the sputtering target; and a position corresponding to the other end (end B) of the length of the sputtering target. The standard deviation of the measured thicknesses was also determined.

Table 1 shows the results.

TABLE 1

| | Target type | Added element | Content [wtppm] | Target forming method | Casting atmosphere | Presence or absence of plastic working | Working amount [%] |
|---|---|---|---|---|---|---|---|
| Example 1 | Cylinder | Cu | 5 | Casting | Air | Present | 14.3 |
| Example 2 | Cylinder | Cu | 20 | Casting | Air | Present | 14.3 |
| Example 3 | Cylinder | Cu | 50 | Casting | Air | Present | 14.3 |
| Example 4 | Cylinder | Cu | 100 | Casting | Air | Present | 14.3 |
| Example 5 | Cylinder | Cu | 1000 | Casting | Air | Present | 14.3 |
| Example 6 | Cylinder | Cu | 10000 | Casting | Air | Present | 14.3 |
| Example 7 | Cylinder | Cu | 100 | Casting | Air | Present | 50.0 |
| Example 8 | Cylinder | Cu, S | Cu: 100, S: 100 | Casting | Air | Present | 14.3 |
| Example 9 | Cylinder | Cu, Zn | Cu: 100, Zn: 100 | Casting | Air | Present | 14.3 |
| Example 10 | Disk | Cu | 100 | Casting | Air | Present | 80.0 |
| Example 11 | Disk | Cu | 10000 | Casting | Air | Present | 80.0 |
| Example 12 | Cylinder | Cu | 5 | Casting | Nitrogen | Present | 14.3 |
| Comparative Example 1 | Cylinder | Absent | — | Casting | Air | Present | 14.3 |
| Comparative Example 2 | Cylinder | Absent | — | Casting | Air | Absent | 0 |
| Comparative Example 3 | Cylinder | Absent | — | Thermal spraying | — | Absent | 0 |
| Comparative Example 4 | Cylinder | Cu | 100 | Thermal spraying | — | Absent | 0 |

TABLE 1-continued

| | | | | | | | | |
|---|---|---|---|---|---|---|---|---|
| Comparative Example 5 | Cylinder | Cu | 100 | Casting | Air | Absent | | 0 |

| | Average grain size [μm] | Relative density [%] | Oxygen concentration [wtppm] | Central part thickness [Å] | End A thickness [Å] | End B thickness [Å] | Thickness standard deviation | Arcing (times/h) |
|---|---|---|---|---|---|---|---|---|
| Example 1 | 3000 | 99 | 20 | 2385 | 2365 | 2425 | 30.6 | 0 |
| Example 2 | 2000 | 99 | 20 | 2380 | 2399 | 2433 | 26.9 | 0 |
| Example 3 | 450 | 99 | 20 | 2344 | 2350 | 2389 | 24.4 | 0 |
| Example 4 | 300 | 99 | 20 | 2311 | 2355 | 2330 | 22.1 | 0 |
| Example 5 | 200 | 99 | 20 | 2300 | 2324 | 2285 | 19.7 | 0 |
| Example 6 | 100 | 99 | 20 | 2241 | 2250 | 2265 | 12.1 | 0 |
| Example 7 | 150 | 99 | 20 | 2230 | 2212 | 2237 | 12.9 | 0 |
| Example 8 | 500 | 99 | 20 | 2334 | 2384 | 2355 | 25.1 | 0 |
| Example 9 | 400 | 99 | 20 | 2334 | 2375 | 2334 | 23.7 | 0 |
| Example 10 | 100 | 99 | 20 | 2254 | 2248 | 2231 | 11.9 | 0 |
| Example 11 | 30 | 99 | 20 | 2115 | 2123 | 2135 | 10.1 | 0 |
| Example 12 | 3000 | 99 | 10 | 2389 | 2436 | 2354 | 41.1 | 0 |
| Comparative Example 1 | 11200 | 99 | 20 | 2400 | 2412 | 2352 | 31.7 | 0 |
| Comparative Example 2 | 40000 | 99 | 20 | 2211 | 1911 | 1901 | 176.2 | 0 |
| Comparative Example 3 | 50 | 90 | 1000 | 2250 | 2250 | 2190 | 34.6 | 20 |
| Comparative Example 4 | 50 | 90 | 1000 | 2240 | 2255 | 2188 | 35.2 | 20 |
| Comparative Example 5 | 40000 | 99 | 20 | 2210 | 1920 | 1942 | 161.5 | 0 |

It is apparent from Table 1 that in Examples 1 to 6, the addition of 5 wtppm or more of Cu reduces the average grain size and that the crystal grains become finer as the Cu content increases in the range of 5 wtppm to 10,000 wtpmm. A comparison between Examples 4, 7, and 10 shows that when the Cu content is constant, the crystal grains become finer as the working amount increases.

It is also apparent that the effect of making crystal grains fine is also sufficiently produced even when an impurity such as S or Zn is contained at 100 wtppm or less as in Example 8 or 9. Crystal grains are made small also in disk-shaped sputtering targets such as those of Examples 10 and 11. This shows that the present invention is applicable not only to cylindrical sputtering targets but also disk-shaped, rectangular, or other planar sputtering targets. Example 12 shows that the casting under a nitrogen atmosphere reduces the oxygen concentration to 10 wtppm.

In Comparative Example 1, the grain size is relatively large because Cu is not added, and there are some rooms to improve the film thickness distribution. In Comparative Example 2, the grain size is relatively large, and the film thickness distribution is not uniform, because the plastic working is not performed after the raw material is formed by the casting. The target of Comparative Example 3 has a low relative density and causes arcing although it has a small grain size because it is formed by thermal spraying. Although formed by thermal spraying without plastic working, the target of Comparative Example 4 has a small grain size and provides a uniform film thickness distribution. However, the target of Comparative Example 4 has a low relative density and causes arcing to make sputtering unstable. Although containing Cu, the target of Comparative Example 5 has coarse crystal grains and provides a non-uniform film thickness distribution because the plastic working is not performed after the casting.

It is therefore apparent that the present invention makes it possible to form uniformly thick films by sputtering while removing the risk of arching.

REFERENCE SIGNS LIST

1: sputtering target raw material
2: backing tube
10: core rod
20: base
21: support
21a: inclined surface
22: pressing means
22a: flat surface

The invention claimed is:

1. A sputtering target comprising:
   5 wtppm to 10,000 wtppm of Cu; and
   the balance of In,
   the sputtering target having a relative density of at least 99%, an average grain size of at most 3,000 μm and an oxygen concentration of at most 20 wtppm.

2. The sputtering target according to claim 1, wherein the average grain size is from 10 μm to 1,000 μm.

3. The sputtering target according to claim 2, wherein the average grain size is from 10 μm to 500 μm.

4. The sputtering target according to claim 3, wherein the average grain size is from 10 μm to 300 μm.

5. The sputtering target according to claim 1, further comprising at most 100 wtppm of at least one selected from S, Cd, Zn, Se, Mg, Ca, and Sn.

6. The sputtering target according to claim 1, which has a cylindrical shape.

7. A method for producing the sputtering target according to claim 1, the method comprising:
   forming a sputtering target raw material in such a manner that the sputtering target raw material is bonded to a surface of a supporting substrate, wherein the sputtering target raw material comprises 5 wtppm to 10,000 wtppm of Cu and the balance of In; and
   then subjecting the sputtering target raw material to plastic working in a thickness direction of the sputtering target raw material at a thickness reduction rate in the range of 10% to 80%.

8. The method for producing a sputtering target according to claim 7, wherein the sputtering target raw material further comprises at most 100 wtppm, in total, of at least one selected from S, Cd, Zn, Se, Mg, Ca, and Sn.

9. The method for producing a sputtering target according to claim 7, wherein the supporting substrate is a cylindrical backing tube on which a cylindrical sputtering target is produced.

10. The method for producing a sputtering target according to claim 7, wherein the sputtering target raw material is formed by casting a molten metal.

11. The method for producing a sputtering target according to claim 10, wherein the molten metal is stirred or agitated during the casting.

12. The method for producing a sputtering target according to claim 10, wherein the casting is performed under a nitrogen or Ar atmosphere.

* * * * *